(12) United States Patent
Tolle et al.

(10) Patent No.: US 11,264,255 B2
(45) Date of Patent: Mar. 1, 2022

(54) PRE-CLEAN CHAMBER AND PROCESS WITH SUBSTRATE TRAY FOR CHANGING SUBSTRATE TEMPERATURE

(71) Applicant: ASM IP HOLDING B.V., Almere (NL)

(72) Inventors: John Tolle, Gilbert, AZ (US); Eric R. Hill, Goodyear, AZ (US)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 16/447,297

(22) Filed: Jun. 20, 2019

(65) Prior Publication Data
US 2019/0333793 A1    Oct. 31, 2019

Related U.S. Application Data

(62) Division of application No. 14/645,158, filed on Mar. 11, 2015, now Pat. No. 10,373,850.

(51) Int. Cl.
*B05C 9/14* (2006.01)
*H01L 21/67* (2006.01)

(52) U.S. Cl.
CPC .......... *H01L 21/67248* (2013.01); *B05C 9/14* (2013.01); *H01L 21/6719* (2013.01); *H01L 21/67109* (2013.01)

(58) Field of Classification Search
CPC ......... C23C 14/541; C23C 16/44; C23F 1/00; C23F 1/08; B05C 9/14; B29C 14/46
(Continued)

(56) References Cited

U.S. PATENT DOCUMENTS 4,361,461 A    11/1982 Chang
4,517,223 A    5/1985  Ovshinsky et al.
(Continued)

FOREIGN PATENT DOCUMENTS

CN    1912194 A      2/2007
CN    101330044 A    12/2008
(Continued)

OTHER PUBLICATIONS

European Search Report dated Nov. 16, 2015 received in corresponding EP App. No. 15158948, filed Mar. 13, 2015, in 7 pages.
(Continued)

*Primary Examiner* — Tabassom Tadayyon Eslami
(74) *Attorney, Agent, or Firm* — Knobbe, Martens, Olson & Bear LLP

(57) ABSTRACT

A system for removing an oxide material from a surface of a substrate can include a substrate tray to receive the substrate, and a cooling body to receive the substrate tray. The system may include a first temperature control element configured to control a temperature of the substrate tray and a second temperature control element configured to control a temperature of the cooling body, where the first temperature control element and the second temperature control element can be independently controlled. A method for removing oxide material from a surface of a substrate can include providing the substrate on a substrate tray having heating elements, cooling the substrate by transferring heat from the substrate tray to a cooling body, depositing a halogen-containing material on the cooled substrate while the substrate is on the cooling body, and subsequently sublimating the halogen-containing material by heating the cooled substrate by transferring heat from the substrate tray to the substrate.

20 Claims, 5 Drawing Sheets

(58) Field of Classification Search
USPC .................................................. 118/724, 69
See application file for complete search history.

(56) References Cited

U.S. PATENT DOCUMENTS

| | | | |
|---|---|---|---|
| 4,615,905 A | 10/1986 | Ovshinsky et al. | |
| 4,632,057 A | 12/1986 | Price et al. | |
| 4,699,689 A | 10/1987 | Bersin | |
| 4,820,377 A | 4/1989 | Davis et al. | |
| 4,904,621 A | 2/1990 | Loewenstein et al. | |
| 4,913,929 A | 4/1990 | Moslehi et al. | |
| 5,030,319 A | 7/1991 | Nishino et al. | |
| 5,100,504 A | 3/1992 | Kawai et al. | |
| 5,138,973 A | 8/1992 | Davis et al. | |
| 5,198,634 A | 3/1993 | Mattson et al. | |
| 5,228,206 A | 7/1993 | Grant et al. | |
| 5,248,636 A | 9/1993 | Davis et al. | |
| 5,338,393 A | 8/1994 | Burmer | |
| 5,403,434 A | 4/1995 | Moslehi | |
| 5,620,559 A | 4/1997 | Kikuchi | |
| 5,686,748 A | 11/1997 | Thakur et al. | |
| 5,698,039 A | 12/1997 | Patz et al. | |
| 5,730,803 A | 3/1998 | Steger et al. | |
| 5,892,207 A * | 4/1999 | Kawamura | C23C 16/46 |
| | | | 219/492 |
| 5,923,966 A | 7/1999 | Teramoto et al. | |
| 5,939,831 A | 8/1999 | Fong et al. | |
| 5,992,429 A | 11/1999 | Peckman | |
| 6,008,128 A | 12/1999 | Habuka et al. | |
| 6,063,300 A | 5/2000 | Suzuki et al. | |
| 6,071,823 A | 6/2000 | Hung et al. | |
| 6,077,353 A | 6/2000 | Al-Sharif et al. | |
| 6,079,426 A | 6/2000 | Subrahmanyam et al. | |
| 6,107,192 A | 8/2000 | Subrahmanyam et al. | |
| 6,110,836 A | 8/2000 | Cohen et al. | |
| 6,153,529 A | 11/2000 | Agarwal | |
| 6,165,273 A | 12/2000 | Fayfield et al. | |
| 6,197,694 B1 | 3/2001 | Beinglass | |
| 6,313,042 B1 | 11/2001 | Cohen et al. | |
| 6,319,861 B1 | 11/2001 | Shih et al. | |
| 6,329,297 B1 | 12/2001 | Balish et al. | |
| 6,339,028 B2 | 1/2002 | Tesauro | |
| 6,346,489 B1 | 2/2002 | Cohen et al. | |
| 6,347,636 B1 | 2/2002 | Xia et al. | |
| 6,372,657 B1 | 4/2002 | Hineman et al. | |
| 6,374,831 B1 | 4/2002 | Chandran et al. | |
| 6,395,192 B1 | 5/2002 | Nemirovsky et al. | |
| 6,457,478 B1 | 10/2002 | Danese | |
| 6,498,107 B1 | 12/2002 | Fenner | |
| 6,514,886 B1 | 2/2003 | U'Ren | |
| 6,534,412 B1 | 3/2003 | Lin | |
| 6,537,876 B2 | 3/2003 | Chung et al. | |
| 6,706,334 B1 | 3/2004 | Kobayashi et al. | |
| 6,767,834 B2 | 7/2004 | Chung et al. | |
| 6,776,874 B2 | 8/2004 | Kobayashi et al. | |
| 7,153,772 B2 | 12/2006 | Granneman et al. | |
| 7,235,492 B2 | 6/2007 | Samoilov | |
| 7,396,480 B2 | 7/2008 | Kao et al. | |
| 7,416,989 B1 | 8/2008 | Liu et al. | |
| 7,494,545 B2 | 2/2009 | Lam et al. | |
| 7,604,708 B2 | 10/2009 | Wood et al. | |
| 7,651,948 B2 | 1/2010 | Kim et al. | |
| 7,704,887 B2 | 4/2010 | Fu et al. | |
| 7,767,024 B2 | 8/2010 | Kao et al. | |
| 7,780,793 B2 | 8/2010 | Yang et al. | |
| 8,043,972 B1 | 10/2011 | Liu et al. | |
| 8,187,486 B1 | 5/2012 | Liu et al. | |
| 8,445,352 B2 | 5/2013 | Yokoyama et al. | |
| 8,445,389 B2 | 5/2013 | Zojaji et al. | |
| 8,551,880 B2 | 10/2013 | Mebarki et al. | |
| 8,592,328 B2 | 11/2013 | Hausmann et al. | |
| 8,772,162 B2 | 7/2014 | Zheng et al. | |
| 8,951,913 B2 | 2/2015 | Zheng et al. | |
| 8,956,980 B1 | 2/2015 | Chen et al. | |
| 9,299,557 B2 | 3/2016 | Tolle et al. | |
| 9,474,163 B2 | 10/2016 | Tolle et al. | |
| 9,514,927 B2 | 12/2016 | Tolle et al. | |
| 10,373,850 B2 | 8/2019 | Tolle et al. | |
| 2001/0032704 A1 | 10/2001 | Tesauro | |
| 2002/0045355 A1 | 4/2002 | Chong et al. | |
| 2002/0106908 A1 | 8/2002 | Cohen et al. | |
| 2002/0108930 A1 | 8/2002 | Nemirovsky et al. | |
| 2002/0124867 A1 | 9/2002 | Kim et al. | |
| 2002/0151156 A1 | 10/2002 | Hallock et al. | |
| 2003/0019858 A1 * | 1/2003 | Dornfest | C23C 14/541 |
| | | | 219/158 |
| 2003/0060030 A1 | 3/2003 | Lee et al. | |
| 2006/0024970 A1 | 2/2006 | Smith et al. | |
| 2006/0196527 A1 | 9/2006 | Nishimura et al. | |
| 2008/0236493 A1 | 10/2008 | Sakao | |
| 2008/0299326 A1 * | 12/2008 | Fukazawa | C23C 16/458 |
| | | | 427/569 |
| 2009/0179003 A1 * | 7/2009 | Nishimura | H01J 37/321 |
| | | | 216/41 |
| 2010/0041212 A1 | 2/2010 | Jinzu et al. | |
| 2010/0240218 A1 | 9/2010 | Ugajin | |
| 2011/0024047 A1 | 2/2011 | Nguyen et al. | |
| 2011/0140246 A1 | 6/2011 | Hoenk et al. | |
| 2012/0193071 A1 * | 8/2012 | Tsunekawa | H01L 21/6719 |
| | | | 165/61 |
| 2012/0193216 A1 * | 8/2012 | Endo | H01J 37/34 |
| | | | 204/192.1 |
| 2012/0196447 A1 | 8/2012 | Yang et al. | |
| 2012/0220116 A1 | 8/2012 | Noori et al. | |
| 2013/0309875 A1 | 11/2013 | Huang et al. | |
| 2014/0011339 A1 | 1/2014 | Zheng et al. | |
| 2014/0252565 A1 | 9/2014 | Greer et al. | |
| 2014/0264281 A1 | 9/2014 | Niyogi et al. | |
| 2014/0268479 A1 * | 9/2014 | West | H01L 21/67109 |
| | | | 361/234 |
| 2014/0273493 A1 | 9/2014 | Limdulpaiboon et al. | |
| 2015/0079799 A1 * | 3/2015 | Nemani | H01J 37/32082 |
| | | | 438/714 |
| 2016/0192502 A1 | 6/2016 | Tolle et al. | |

FOREIGN PATENT DOCUMENTS

| | | |
|---|---|---|
| CN | 101459071 A | 6/2009 |
| CN | 102427027 A | 4/2012 |
| CN | 103943494 A | 7/2014 |
| JP | 02-256235 | 10/1990 |
| JP | 4-07045523 | 2/1995 |
| KR | 10-2012-0034341 | 4/2012 |
| TW | 2012-10028 | 3/2012 |
| TW | 201246359 | 11/2012 |

OTHER PUBLICATIONS

Nishino, H., Hayasaka, N., and Okano, H., "Damagefree selective etching of Si native oxides using NH3/NF3 and SF6/H2O downflow etching," Journal of Applied Physics, Jun. 1993, vol. 74, Issue 2, p. 1345.

Office Action from U.S. Appl. No. 14/220,001 dated Jun. 30, 2015 in 12 pages.

Office Action from co-pending U.S. Appl. No. 14/586,438 dated Jan. 15, 2016, in 11 pages.

* cited by examiner

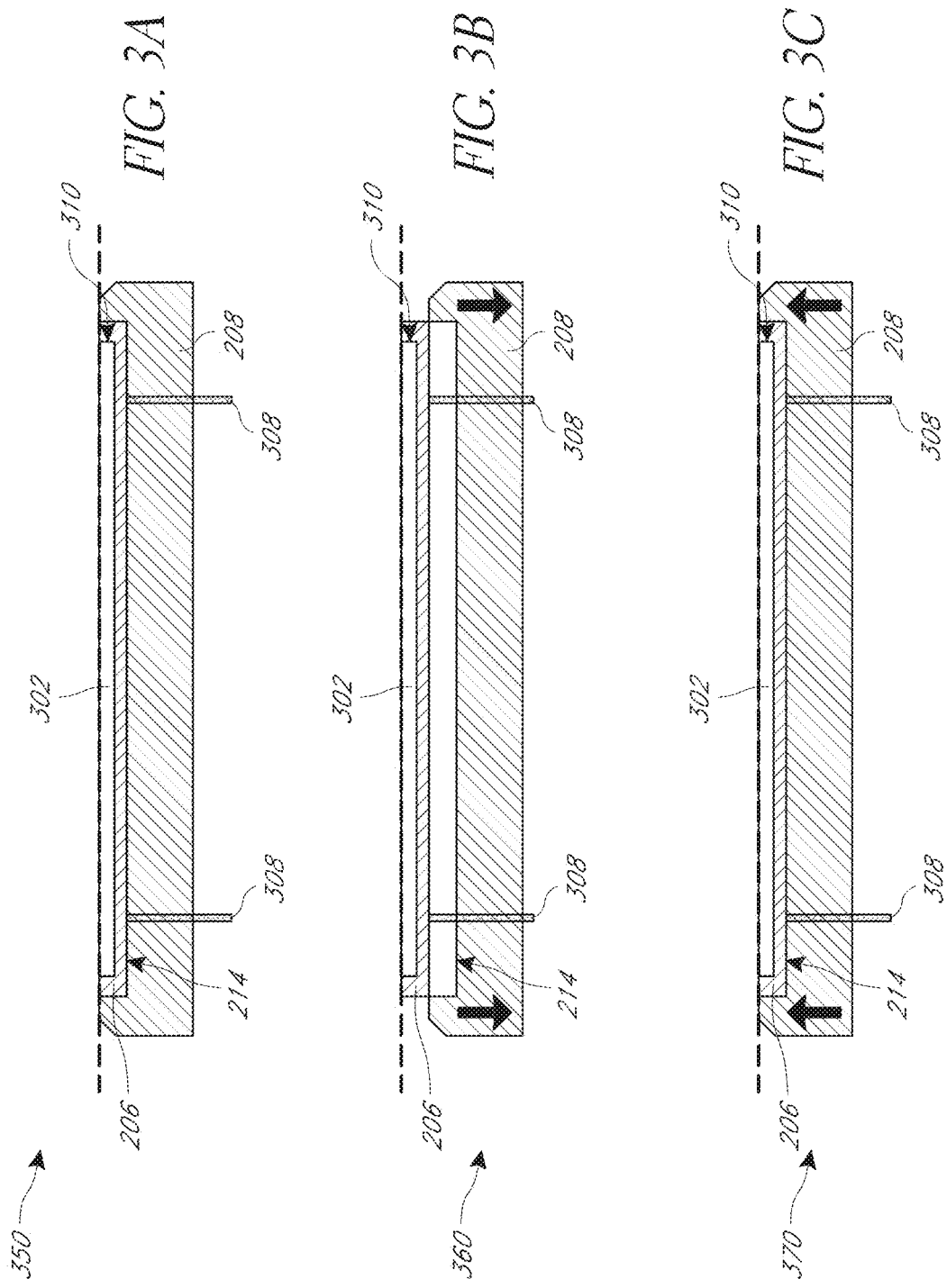

PRE-CLEAN CHAMBER AND PROCESS WITH SUBSTRATE TRAY FOR CHANGING SUBSTRATE TEMPERATURE

CROSS REFERENCE TO RELATED APPLICATION

This patent application is a divisional of U.S. patent application Ser. No. 14/645,158, filed Mar. 11, 2015, the entire disclosure of which is incorporated by reference herein.

BACKGROUND

Field

The present invention relates to the fabrication of integrated circuits, particularly to methods and apparatuses for pre-cleaning a substrate.

Description of the Related Art

Fabrication of integrated circuits often can involve formation of one or more material layers on a substrate surface. These material layers can include, for example, mono-crystalline, polycrystalline, and/or amorphous material layers. Formation of the material layers can be achieved using various thin film deposition techniques, including various physical (e.g., physical sputtering) and/or chemical (e.g., chemical vapor deposition, atomic layer deposition, and/or epitaxial deposition) deposition techniques. For example, mono-crystalline material formation on a substrate surface can be performed using an epitaxial deposition process, such as for formation of mono-crystalline semiconductor materials (e.g., mono-crystalline silicon).

The presence of an intervening material (e.g., a native oxide layer, such as a silicon oxide material layer on a silicon substrate) on the substrate surface may interfere with formation of a desired material layer over that substrate surface. For example, the intervening material may cause introduction of an increased number of defects in the structure of the desired material layer and/or may adversely affect an electrical performance of the desired material layer. In some embodiments, an intervening material such as a native oxide material may form on a substrate surface due to exposure of the substrate to oxygen during the integrated circuit fabrication process (e.g., exposure to ambient air during transfer of the substrate between fabrication systems, and/or to residual oxidizing agents within fabrication systems).

Accordingly, there is a continuing need for apparatuses and processes for forming high quality layers on a substrate surface.

SUMMARY

A system for integrated circuit fabrication can include a reaction chamber for processing a substrate, a substrate tray within the reaction chamber to receive the substrate, and a cooling body to receive the substrate tray. The system can include a first temperature control element configured to control a temperature of the substrate tray and a second temperature control element configured to control a temperature of the cooling body, where the first and second temperature control elements are configured to independently control the temperatures of the substrate tray and the cooling body.

A method for integrated circuit fabrication can include removing oxide material from a surface of a substrate, where the surface includes silicon. Removing the oxide material can include providing the substrate on a substrate tray having heating elements, cooling the substrate by transferring heat from the substrate tray to a cooling body, depositing a halogen-containing material on the cooled substrate while the substrate is on the substrate tray, and subsequently sublimating the halogen-containing material by heating the cooled substrate by transferring heat from the substrate tray to the substrate.

A method for integrated circuit fabrication can include removing oxide material from a surface of a substrate. The surface may include silicon. Removing the oxide material may include placing the substrate on a substrate tray, where the substrate tray is over a cooling body. The method may include depositing a halogen-containing material on the surface, and sublimating the halogen-containing material by controlling a temperature of the substrate tray independently from a temperature of the cooling body.

BRIEF DESCRIPTION OF THE DRAWINGS

Various features, aspects, and advantages of the present disclosure are described with reference to the drawings of certain embodiments, which are intended to illustrate certain embodiments and not to limit the invention.

FIGS. 3A, 3B and 3C show a side cross-sectional view of a substrate tray and a cooling body, according to some embodiments.

DETAILED DESCRIPTION

Figure 1:
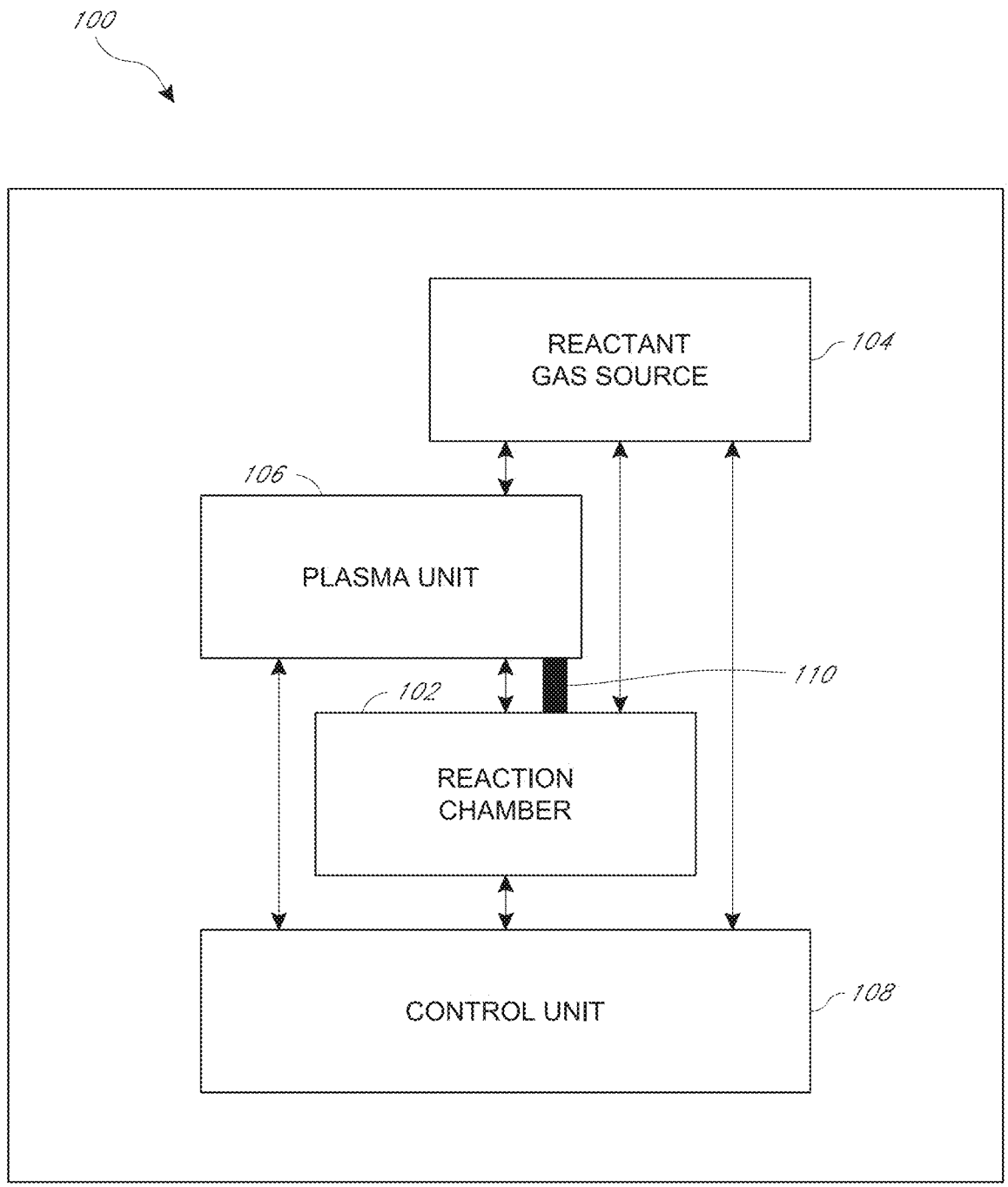
FIG. 1 is a schematic diagram of a pre-clean system, according to some embodiments.

Various embodiments are described herein in relation to pre-cleaning apparatuses and processes for removing oxide material from an exposed surface of a substrate. It will be understood that the resulting pre-cleaned surface can provide a surface that facilitates the later formation of high quality layers of materials, such as the epitaxial growth of silicon.

In some embodiments, a system for integrated circuit fabrication can provide rapid cycling between two or more temperatures, which may advantageously be applied to a process to pre-clean substrate surfaces by removing undesired materials, such as oxide materials. The system may include a substrate tray to receive the substrate, and a cooling body to receive the substrate tray. For example, the substrate may be accommodated over and in direct contact with the substrate tray, and the substrate tray may be accommodated over and optionally in direct contact with the cooling body. The system may include a first temperature control element configured to control a temperature of the substrate tray and a second temperature control element configured to control a temperature of the cooling body. The first temperature control element and the second temperature control element may be independently controlled. For example, a temperature of the substrate tray may be independently controlled relative to a temperature of the cooling body. In some embodiments, the substrate tray and the cooling body may have different temperature set points, which are maintained using separate sets of thermocouples and heating elements and/or cooling elements, a different set for each of the substrate tray and the cooling body. In some embodiments, the cooling body includes cooling elements while the substrate tray does not include cooling elements.

It will be appreciated that the substrate tray's heating elements may heat the tray and a substrate on that tray, while the cooling body provides an outlet for transferring heat from the substrate tray, thereby cooling the substrate. Preferably, the mass of the cooling body is substantially more than the mass of the substrate tray. In some embodiments, a ratio of the mass of the cooling body to the mass of substrate tray is about 20:1 or higher, including about 10:1 to about 50:1, or about 10:1 to about 30:1. In some embodiments, the ratio of the mass of the cooling body to the mass of substrate tray can be about 19:1. The substrate tray may be quickly heated due to its relatively low mass, while the relatively high mass of the cooling body allows for the tray to be quickly cooled by transferring heat to the cooling body upon thermal contact between the tray and the cooling body. Thus, rapid heating and cooling of a substrate on the tray may be accomplished. This rapid cycling between temperatures can provide advantages for pre-cleaning the substrate, and achieving high selectivity for the removal of oxide, as discussed herein.

In some embodiments, the cooling body can be moved relative to the substrate tray to heat and cool the tray. For example, the cooling body may be moved away from the substrate tray to heat the tray (such that the separation prevents or reduces heat loss from the tray to the cooling body). Cooling may be achieved by bringing the substrate tray and the cooling body in direct contact with one another (such that heat from the tray is transferred to the cooling body).

In some other embodiments, the tray is affixed to the cooling body. In such an arrangement, the tray may be heated by providing or increasing heating power to heating elements of that tray, while the tray may be cooled by stopping or decreasing heating power to the heating elements of the tray. Throughout, the cooling body may be maintained at a lower temperature than the tray and acts as a heat sink in contact with the tray.

As discussed herein, the thermal cycling provided by the substrate tray and the cooling body may advantageously be applied to pre-cleaning substrates. In some embodiments, a process for integrated circuit fabrication includes pre-cleaning a substrate surface to remove an oxide material from the surface. The oxide material may comprise a native oxide material formed on a surface comprising silicon and/or germanium, including for example an oxide of silicon, an oxide of germanium, and/or an oxide of germanium and silicon (e.g., silicon oxide, germanium oxide, silicon germanium oxide). Deposition of a pre-clean material and subsequent volatilization of the pre-clean material can advantageously cause removal of the oxide material from the substrate surface.

Without being limited by theory, it is believed that, to form the pre-clean material, reactant species flowed into the reaction chamber during the pre-clean process may chemically interact with the undesired material on the substrate surface. In some embodiments, the pre-clean material may comprise one or more components generated from chemical reactions between the reactant species and a substrate surface oxide material and/or chemical reactions between the reactant species themselves. For example, a pre-clean process may use a reactant gas comprising a halogen such that the halogen-containing reactant gas chemically reacts with a substrate surface silicon oxide to form a halogen-containing pre-clean material comprising halogen and silicon, which may subsequently be sublimated, thereby removing the silicon oxide. In some embodiments, the reactant gas may also include a hydrogen-containing gas (e.g., ammonia). In some embodiments, the reactant gas may also include a carrier gas (e.g., an inert gas).

In some embodiments, one or more apparatuses and processes described herein may be applied to form the pre-clean material and to subsequently remove the pre-clean material in the same reaction chamber. It will be appreciated that the pre-clean material may be formed at a temperature higher than the ambient temperature of the reaction chamber (e.g., higher than room temperature). In some embodiments, the cooling body may be at a higher than ambient temperature to facilitate establishing and appropriate temperature for pre-clean material formation on the substrate. As a result, heat may be applied to the cooling body during formation of the pre-clean material while no heat or only a low amount of heat is applied to the substrate tray. For example, heating elements coupled to the cooling body may be turned on while heating elements coupled to the substrate tray are set and a relatively low-level or are off during formation of the pre-clean material. In some other embodiments, heating elements coupled to the cooling body are not turned on during formation of the pre-clean material. In some embodiments, both heating elements and cooling elements coupled to the cooling body are turned to regulate the temperature of the cooling body during formation of the pre-clean material.

In some embodiments, the removal is accomplished by volatizing the pre-clean material, such as by sublimating the material. In some embodiments, heat is applied to the substrate tray to heat the substrate to a sublimation temperature and thereby facilitate desired sublimation of the pre-clean material. For example, heating elements coupled to the substrate tray may be turned on or turned up during the sublimation while maintaining the temperature set point of the cooling body at a lower value than that of the substrate tray. In some embodiments, the temperature set point of the cooling body may be about 75° C. or more, or about 100° C. or more, or about 150° C. or more, or about 200° C. or more less than a temperature set point of the substrate tray for the sublimation. For example, the substrate tray may be heated to a temperature such that the substrate is at a temperature of up to about 400° C. In some embodiments, the substrate tray and the cooling body are in contact with one another during sublimation of the pre-clean material. In such embodiments, some heat may be lost to the cooling body. However, rapid heating of the substrate may nevertheless be accomplished due to the low mass of the substrate tray and the proximity of the heating elements to the substrate (because the heating elements are part of or immediately adjacent to the substrate tray). Heat applied to the substrate tray may be discontinued or reduced after desired sublimation, and contact between the substrate tray and the cooling body may facilitate subsequent cooling of the substrate tray.

In some embodiments, the cooling body and the substrate tray may be in contact with one another during formation of the pre-clean material, and are subsequently separated after formation of the pre-clean material (e.g., the cooling body is moved such that the cooling body is distanced from the substrate tray). For example, the cooling body and the substrate tray may be distanced from one another prior to sublimation of the pre-clean material, and then heated to a sublimation temperature after the separation. In some embodiments, the cooling body is moved subsequent to desired sublimation such that the cooling body is in contact with the substrate tray after desired sublimation is achieved.

In some embodiments, a pre-clean process includes one or more cycles, where each cycle includes depositing a pre-clean material and subsequent removal of the pre-clean material. In some embodiments, the one or more cycles is performed within the same reaction chamber without transferring the substrate to a different chamber. Performing the one or more cycles in a single reaction chamber may facilitate increased throughput. A pre-clean process including more than one cycle may advantageously demonstrate exceptionally high selectivity. For example, as compared to selectivity performance of a single cycle of the pre-clean process, a second cycle and/or other subsequent cycles of the pre-clean process have been found to demonstrate significantly higher selective removal of silicon oxide from the substrate surface relative to removal of another material, such as silicon nitride, from the substrate surface. A pre-clean process including a plurality of cycles of depositing and removing the pre-clean material can facilitate oxide material removal while maintaining desirably low defect counts, including undesired clogging and/or over-etching of one or more features on the substrate surface.

In some embodiments, a high quality surface for the later deposition of a target material is provided by completing the pre-clean process in a first reaction chamber, followed by transferring the substrate to a second chamber to form a target material on the substrate. In some embodiments, the target material is a conductive material. The conductive material may include, without limitation, a semiconductor-containing material (e.g., a silicon-containing material), a metal-containing material, or combinations thereof. As used herein, a target material is a material deposited directly in contact with the pre-cleaned substrate surface. In addition, removing the pre-clean material may include removing part or all of the pre-clean material from the substrate. In some embodiments, the substrate, from which the oxide material is removed, may be patterned (e.g., have a pattern of recesses such as trenches on its surface). In some embodiments, the substrate may include exposed electronic devices (e.g., transistor structures).

In some embodiments, the second reaction chamber may be an epitaxial deposition chamber and the target material may be mono-crystalline silicon. For example, the pre-clean material may be removed from the substrate surface by sublimation in the first reaction chamber to provide a pre-cleaned substrate surface, and epitaxial growth of silicon may be subsequently performed on the pre-cleaned substrate surface in the second reaction chamber to form a mono-crystalline silicon layer on the substrate.

Removal of the pre-clean material in a reaction chamber different from the reaction chamber in which a target material is subsequently formed on the cleaned substrate may advantageously provide formation of the target material in a reaction space free or substantially free from contaminants that may be generated by the pre-clean material process. For example, removal of the pre-clean material in the same reaction chamber in which the target material is subsequently formed may facilitate a reduced defect count and/or improved electrical performance.

Reference will now be made to the Figures, in which like numerals refer to like features throughout.

FIG. 1 shows a schematic diagram of a pre-clean system 100 for pre-cleaning a surface of a substrate, according to some embodiments. The pre-clean system 100 may include a reaction chamber 102, a reactant gas source 104, a plasma unit 106 and a control unit 108. The reaction chamber 102 may be configured to perform the pre-clean process and may comprise a reaction space to receive the substrate. The reactant gas source 104 may be configured to supply one or more components of the reactant gas for the pre-clean process. For example, reactant gas source 104 may include one or more containers, each containing a reactant gas or a component of a reactant gas. The plasma unit 104 may comprise a plasma generator configured to activate one or more components of the reactant gas. In some embodiments, the plasma unit 106 comprises a remote plasma unit. The reactant gas source 104 may be in fluid communication with the plasma unit 106 such that one or more components of the reactant gas may be activated by the plasma unit 106 before being introduced into the reaction chamber 102. The reaction chamber 102 may be in fluid communication with either or both of the reactant gas source 104 and the plasma unit 106. Activated and/or unactivated components of the reactant gas may be flowed into the reaction chamber 102. For example, both activated and unactivated reactant gas components may be flowed into the reaction chamber 102 simultaneously or sequentially. The control unit 108 can be configured to control one or more parameters of the pre-clean process. In some embodiments, the control unit 108 can be in electrical communication with one or more of the reaction chamber 102, the reactant gas source 104, and the plasma unit 106. For example, the control unit 108 may communicate with the plasma unit 106 to control an operating power of the plasma unit 106, with the reactant gas source 104 to control a flow of reactant gas from the reactant gas source 104, and/or with the reaction chamber 102 to control one or more process conditions.

In some embodiments, the reaction chamber 102 can be in fluid communication with the remote plasma unit 106 through a transfer tube 110. The transfer tube 110 can be configured to deliver a reactant gas into the reaction chamber 102 (e.g., a reactant gas comprising a hydrogen-containing gas, a fluorine-containing gas, and/or a carrier gas) via a reaction chamber gas inlet for the reaction chamber 102. In some embodiments, the transfer tube 110 can include a transfer tube gas inlet configured to allow introduction into the reaction chamber of one or more components of the reactant gas which is not activated by the remote plasma unit. The transfer tube 110 gas inlet may be located proximate to the reaction chamber gas inlet, or at another suitable location on the transfer tube 110. In some embodiments, at least a portion of the transfer tube 110 can be maintained at a desired temperature. For example, a portion of the transfer tube 110 may be heated (e.g., to a temperature of about 60° C. to about 115° C., including about 80° C. to about 115° C.), including the portion of the transfer tube 110 adjacent to and/or surrounding the portion between the transfer tube gas inlet and the reaction chamber gas inlet. In some embodiments, the entire length or substantially the entire length of the transfer tube 110 is maintained at a desired temperature (e.g., heated to a temperature of about 30° C. to about 120° C.).

In some embodiments, at least a portion of the transfer tube 110 can be maintained at a desired temperature by using a heater jacket (e.g., covering at least a portion of an exterior surface of the transfer tube 110 with a heater jacket) and/or a material coating (e.g., coating at least a portion of an exterior surface of the transfer tube 110 with the material coating, such as a material coating comprising alumina, including pyrolytic alumina). In some embodiments, a temperature of the transfer tube 110 can be monitored using one or more thermocouples placed at one or more locations along the transfer tube 110. Temperature along a heated portion of the transfer tube 110 may or may not be uniform. In some embodiments, a temperature along the heated portion of the transfer tube 110 can be maintained at one or substantially one desired temperature. In some embodiments, a temperature of one heated portion of the transfer tube 110 may be significantly different from that of another heated portion of the transfer tube 110.

In some embodiments, one or more components of the reactant gas, such as a carrier gas (e.g., an inert gas, such as argon) and a fluorine-containing gas (e.g., nitrogen trifluoride), can be activated by being flowed through the remote plasma unit 106. In some embodiments, one or more constituents of the reactant gas not activated by the remote plasma unit 106, including for example, a hydrogen-containing gas such as ammonia gas, can be introduced downstream of the remote plasma unit 106 at a position along the transfer tube 110 via the transfer tube gas inlet. Portions of the transfer tube 110 proximate to the transfer tube gas inlet and/or the transfer tube gas inlet itself may be heated such that one or more of the unactivated components of the reactant gas, such as unactivated ammonia, can be delivered into the reaction chamber 102 at a desired temperature.

Figure 2A:
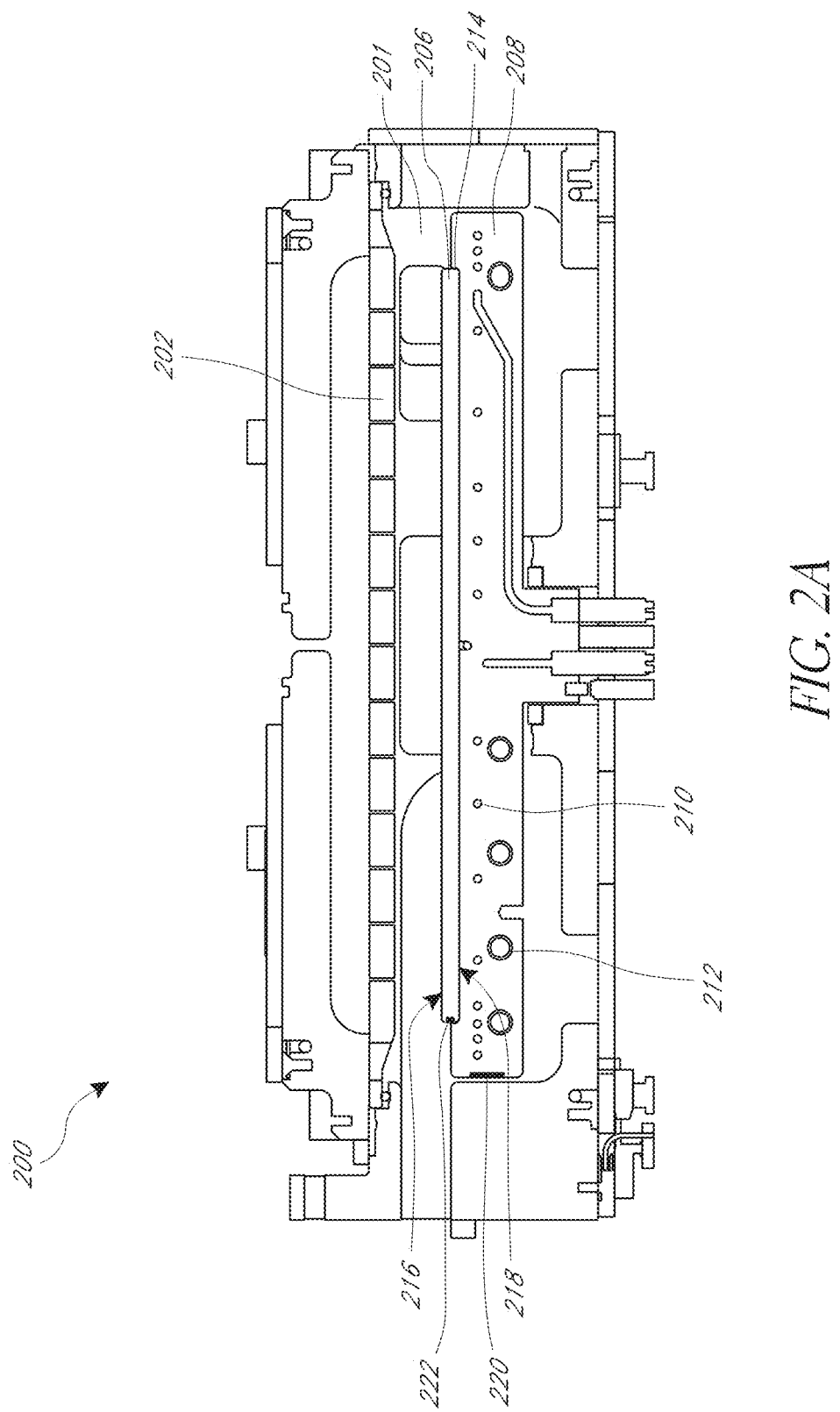
FIG. 2A shows a side cross-sectional view of an example of a reaction chamber configured to perform pre-clean processes, according to some embodiments.

FIG. 2A shows a schematic diagram of an example of a reactor 200 configured to perform at least a portion of a pre-clean process described herein. In some embodiments, both depositing a pre-clean material onto a substrate surface and removing the deposited pre-clean material can be performed within a reaction chamber 201 of the reactor 200. The reaction chamber 201 may be a part of a pre-clean system, and may correspond to the reaction chamber 102 of FIG. 1. In some embodiments, the reaction chamber 201 may be part of a multi-chamber processing system, such that a substrate processed by reaction chamber 201 may be transferred to a second reaction chamber without or substantially without being exposed to ambient air. For example, the reaction chamber 201 may be a part of a cluster tool system. In some other embodiments, the reaction chamber 201 may be a stand-alone chamber and it not part of a multi-chamber processing system.

With continued reference to FIG. 2A, the reactor 200 can include a substrate tray 206 within the reaction chamber 201. The substrate tray 206 can be configured to receive the substrate (e.g., a wafer, including a 300 mm wafer). The substrate tray 206 may be positioned over a cooling body 208. In some embodiments, the cooling body 208 is a susceptor. As shown in FIG. 2A, a showerhead 202 may be positioned over the substrate tray 206. The cooling body 208 and the substrate tray 206 can be maintained at a desired distance from the showerhead 202. The showerhead 202 (e.g., a gas distribution plate) can be downstream of a reactant gas inlet of the reaction chamber 201. For example, the showerhead 202 may be configured to facilitate improved uniformity in the distribution of gas species over a substrate loaded on the substrate tray 206.

Referring to FIG. 2A, the substrate tray 206 may have an upper surface 216 and an opposite lower surface 218. A substrate can be placed over at least a portion of the upper surface 216, and the opposite lower surface 218 can face the cooling body 208. The upper surface 216 of the substrate tray 206 can be configured to receive the substrate, for example having a shape (e.g., a circular shape) and a lateral dimension configured to accommodate the substrate. For example, the planar portion of the upper surface 216 may be dimensioned such that the substrate can be positioned on and in direct contact with the substrate tray 206 along at least a portion of that upper surface 216. In some embodiments, the upper surface 216 of the substrate tray 206 can be flat or substantially flat. For example, the upper surface 216 of the substrate tray 206 can be formed without any raised edge portion. In some embodiments, the planar portion of the upper surface 216 may have a lateral dimension which includes an additional margin beyond a corresponding lateral dimension of the substrate, for example to provide reliable placement and removal of the substrate from the substrate tray 206. For example, the planar portion may comprise a lateral dimension comprising a margin of about 2 mm to about 5 mm, including about 2 mm to about 3 mm, to provide reliable placement and removal of the substrate from the substrate tray 206. In some embodiments, the substrate may be a 300 millimeter (mm) wafer and the planar portion of the upper surface 216 can be dimensioned to receive the 300 mm wafer. For example, the planar portion of the upper surface 216 can have a lateral dimension which includes a margin of about 2.5 mm around the edge of the 300 mm wafer (e.g., the planar portion of the upper surface 216 having a lateral dimension of about 305 mm to receive a 300 mm wafer).

In some embodiments, the substrate tray 206 can have a thickness to provide one or more desired characteristics. For example, a thickness of the substrate tray 206 may be selected to provide desired mechanical support for the substrate, heat retention, and/or heat transfer properties for transferring heat between the substrate and the cooling body 208. In some embodiments, the substrate tray 206 can have a thickness of about 1 mm to about 5 mm, including about 1 mm to about 4 mm, including about 3 mm. For example, a thickness of a portion the substrate tray 206 in contact with the substrate can have a thickness of about 3 mm.

In some embodiments, the substrate tray 206 can have an upper surface comprising a recess (not shown) configured to receive the substrate. For example, the substrate tray 206 may have a raised edge portion surrounding a recess dimensioned to accommodate the substrate. In some embodiments, the substrate may be wholly or partially seated within the recess.

Referring again to FIG. 2A, the lower surface 218 of the substrate tray 206 may be in contact with the cooling body 208 at a recess 214 on an upper surface of the cooling body 208. For example, the entire or substantially entire lower surface 218 of the substrate tray 206 may be seated within the recess 214 and in direct contact with a corresponding portion of the cooling body 208 within the recess 214.

In some embodiments, the upper surface 216 is flat or planar, or substantially flat or planar, which can facilitate increasing the surface area in contact between the substrate tray 206 and a correspondingly flat substrate. In some embodiments, the substrate tray's lower surface 218 and the surface of the recess 214 of the cooling body can be flat or substantially flat to facilitate contact between the substrate tray 218 and the cooling body 208. Physical contact between the substrate tray 206 and the substrate may facilitate desired heat transfer between the substrate tray 206 and the substrate, and physical contact between the substrate tray 206 and the cooling body 208 may facilitate desired heat transfer between the substrate tray 206 and cooling body 208 (e.g., heat transfer through conduction). In some embodiments, increasing the ease with which heat can transfer between the substrate and the substrate tray 206, or between the substrate tray 206 and the cooling body 208, may facilitate rapid changes in the temperature of the substrate.

In some embodiments, the lower surface 218 can have one or more non-planar portions (not shown) configured to achieve desired contact between the substrate tray 206 and the cooling body 208 to facilitate desired heat transfer between the substrate tray 206 and cooling body 208. For example, the lower surface 218 may have one or more raised or recessed features corresponding to one or more recessed or raised features on an upper surface of the cooling body 208 to facilitate desired surface area contact between the substrate tray 206 and the cooling body 208.

In some embodiments, the substrate tray 206 comprises various materials that are stable under the conditions and exposure to the chemical species used for a pre-clean, as discussed herein. For example, the substrate tray may comprise silicon carbide. In some embodiments, the substrate comprises aluminum nitride. In some embodiments, a cooling body (e.g., the cooling body 208) comprises one or more conductive materials, including a metallic material. For example, the cooling body may comprise aluminum.

As shown in FIG. 2A, the cooling body 208 may include one or more cooling body temperature control features. The cooling body 208 may include one or more heating elements 210 configured to facilitate desired increase in a temperature of the cooling body 208, and one or more cooling elements 212 configured to facilitate desired decrease in the temperature of the cooling body 208. One or both of the heating elements 210 and cooling elements 212 may be embedded within one or more portions of the cooling body 208. For example, a plurality of the heating elements 210 and/or a plurality of the cooling elements 212 may be distributed across a lateral dimension of the substrate stage 208 so as to facilitate desired temperature control across the cooling body 208 (e.g., to achieve a desired temperature profile, such as a uniform or non-uniform temperature profile, across the lateral dimension of the cooling body 208). In some embodiments, one or both of the heating elements 210 and cooling elements 212 are distributed across a lateral dimension of the cooling body so as to facilitate multi-zone temperature control (e.g., dual zone temperature control to facilitate control of a temperature of the cooling body 208 at a center portion and a temperature of the cooling body 208 at an edge portion). As shown in FIG. 2A, both the heating elements 210 and the cooling elements 212 may be embedded at various locations at, or proximate to, both edge portions and center portions of the substrate stage 208.

In some embodiments, a cooling body heating element 210 comprises a resistive heater. In some embodiments, a cooling element 210 comprises a cooling line configured to supply a coolant to the cooling body 208.

As shown in FIG. 2A, one or more cooling body thermocouples 220 configured to measure a temperature of the cooling body 208 may be coupled to the cooling body 208. For example, the one or more cooling body thermocouples 220 may be coupled to an external surface of the cooling body 208. In FIG. 2A, a cooling body thermocouple 220 is shown as being coupled to a side surface of the cooling body 208. In some embodiments, the cooling body thermocouple 220 may be coupled to another external surface of the cooling body 208. Placement of the cooling body thermocouple 220 may be selected to provide desired temperature measurements. For example, more than one cooling body thermocouple 220 may be coupled at different positions on or in the cooling body 208 such that temperature measurements can be taken at the various locations on the cooling body 208 (e.g., to facilitate multi-zone temperature measurements). In some embodiments, the one or more cooling body thermocouples 220 may be embedded (not shown) within the cooling body 208. For example, the one or more cooling body thermocouples 220 may be embedded within the cooling body 208 at various locations to facilitate desired temperature measurement from within the cooling body 208 (e.g., to facilitate multi-zone temperature measurements).

In some embodiments, the substrate tray 206 may include one or more substrate tray temperature control features configured to control the temperature of the substrate tray 206. As shown in FIG. 2A, one or more substrate tray thermocouples 222 may be coupled to a surface of the substrate tray 206. FIG. 2A shows a substrate tray thermocouple 222 coupled to a side surface of the substrate tray 206. In some embodiments, the substrate tray thermocouple 222 may be coupled to another external surface of the substrate tray 206. For example, more than one substrate tray thermocouple 222 may be coupled at different positions along one or more external surfaces of the substrate tray 206 such that temperature measurements can be taken at the various locations on the substrate tray 206 (e.g., to facilitate multi-zone temperature measurements). In some embodiments, the one or more substrate tray thermocouples 222 may be embedded (not shown) within the substrate tray 206. For example, the one or more substrate tray thermocouples 222 may be embedded within the substrate tray 206 at various locations to facilitate desired temperature measurement from within the substrate tray 206 (e.g., to facilitate multi-zone temperature measurements).

Figure 2B:
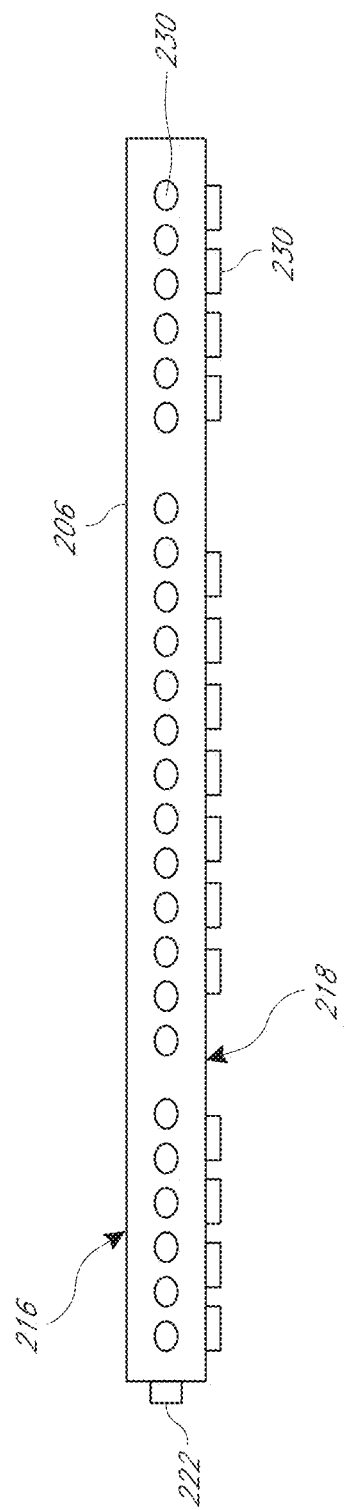
FIG. 2B shows a side cross-sectional view of an example of a substrate tray, according to some embodiments.

FIG. 2B is a schematic diagram of an example of the substrate tray 206. The substrate tray 206 may include a thermocouple 222 on a side external surface. As shown in FIG. 2B, in some embodiments, the substrate tray 206 may also include one or more heating elements 230.

In some embodiments, the one or more substrate tray heating elements 230 can be attached to one or more external surfaces of the substrate tray 206. For example, the one or more heating elements 230 may be laminated (e.g., bonded, and/or physically fastened) to an external surface of the substrate tray 206 opposite a surface facing the substrate, such as the lower surface 218 of the substrate tray 206. The one or more heating elements 230 may be laminated to a surface of the substrate tray facing the cooling body. As shown in FIG. 2B, in some embodiments, the one or more heating elements 230 can be laminated onto various portions of the substrate tray lower surface 218 to facilitate desired temperature control across a lateral dimension of the substrate tray 206. In some embodiments, heating elements 230 may be distributed across the lower surface 218 of the substrate tray 206 in a pattern to facilitate a desired temperature profile across the lateral dimension of the substrate tray 206 (e.g., to achieve multi-zone temperature control). For example, as shown in FIG. 2B, a plurality of heating elements 230 may be attached at, or proximate to, both edge portions and center portions of the lower surface 208 to facilitate desired heating of the edge and center portions of the substrate tray 206. In some embodiments, heating elements 230 laminated to the substrate tray 206 at different locations across a lateral dimension of the substrate tray 206 can be independently controlled to facilitate achieving desired temperature profile across the lateral dimension of the substrate tray 206 (e.g., heating applied to one portion of the substrate tray may be different from that applied to another portion of the substrate tray).

Referring again to FIG. 2B, in some embodiments, the one or more substrate tray heating elements 230 can be embedded within the substrate tray 206. For example, the one or more heating elements 230 can be distributed within the substrate tray 206 at various locations to facilitate multi-zone temperature control for the substrate tray 206. For example, a plurality of heating elements 230 may be embedded at, or proximate to, both edge portions and center portions of the lower surface 218 to facilitate desired heating of the edge and center portions of the substrate tray 206. In some embodiments, heating elements 230 embedded at different locations across a lateral dimension of the substrate tray 206 can be independently controlled to facilitate achieving desired temperature profile across the lateral dimension of the substrate tray 206. In some embodiments, the substrate tray 206 may have embedded heating elements 230 or heating elements 230 on an external surface, but not both. In some other embodiments, the substrate tray 206 may include both embedded and externally attached heating elements 230.

In some embodiments, a substrate tray heating element 230 can be a resistive heater. In some embodiments, a substrate tray heating element 230 comprises a conductive material which can be heated at a desired rate to a target temperature while providing desired thermal stability. In some embodiments, the substrate tray heating element 230 comprises tungsten. In some embodiments, the substrate tray heating element 230 comprises graphite. For example, one or more heating elements 230 comprising tungsten and/or graphite may be laminated to a lower surface of a substrate tray, such as at various locations across the lower surface to facilitate multi-zone temperature control. In some embodiments, heating elements 230 comprising tungsten and/or graphite may be embedded within the substrate tray 206.

In some embodiments, the substrate tray 206 can be heated to a sublimation temperature to facilitate desired sublimation of the pre-clean material from the substrate surface. For example, the substrate tray 206 can be heated to a temperature of about 100° C. to about 500° C., including about 100° C. to about 150° C., about 350° C. to about 500° C. and about 350° C. to about 400° C. For example, the substrate tray 206 may be heated to a temperature of about 120° C. or about 380° C. As evident in the above-noted temperatures, in some embodiments, the substrate tray 206 may be heated and maintained at different temperature set-points at different times, to achieve more complete sublimation of pre-clean material. For example, the tray 206 may first be maintained at a lower temperature set point and then further heated and maintained at a second, higher temperature set point.

The temperatures and temperature control features of the cooling body 208 can be controlled independently from temperature control features of the substrate tray 206. For example, a temperature control feature of the substrate tray 206 can be turned on, turned up, turned down or turned off without turning on, turning up, turning down or turning off a temperature control feature of the cooling body 208. For example, one or more heating elements 230 of the substrate tray 206 may be turned on and/or turned off during a pre-clean process independently from heating elements 210 of the cooling body 208. In some embodiments, one or more heating elements 230 of the substrate tray 206 can be turned on during a pre-clean process to facilitate sublimation of pre-clean material deposited on a substrate surface, independently from control of any temperature control features associated with the cooling body 208 (e.g., the one or more heating elements 210 and/or cooling elements 212 of the cooling body 208). In some embodiments, the one or more heating elements 230 can also be off or turned down such that the substrate can be maintained at a lower temperature for formation of a pre-clean material.

As described herein, a substrate tray 206 may be in direct contact with the cooling body 208. In some embodiments, the substrate tray 206 remains in direct contact with the cooling body 208 during at least a portion of a pre-clean process, e.g., during deposition of the pre-clean material. For example, both the substrate tray 206 and the cooling body 208 may remain stationary (e.g., in direct contact with one another) during this deposition. In some embodiments, the substrate tray 206 and the cooling body 208 can remain stationary and in contact with one another throughout the pre-clean process, including during both deposition of a pre-clean material and subsequent sublimation of the pre-clean material. For example, the one or more heating elements 230 coupled to the substrate tray 206 may be turned on for a desired period during the pre-clean process while the one or more heating elements 210 of the cooling body 208 may not be turned on or may provide a lower level of heat, such that the cooling body 208 remains relatively cooler. In some embodiments, one or more heating elements 230 of the substrate tray 206 can be activated during sublimation of a pre-clean material and can be subsequently turned off once desired sublimation is achieved. Subsequently, the substrate tray 206 may be cooled by contact with the cooling body 208, for example due to heat transfer between the substrate tray 206 and the cooling body 208. Such cooling prepares the substrate or substrate tray 206 for a subsequent deposition of pre-clean material by establishing an appropriate deposition temperature of the substrate or substrate tray 206. In some embodiments, the substrate may then be subjected to another cycle of deposition of pre-clean material and sublimation of that pre-clean material. In some other embodiments, the substrate may be removed from the reaction chamber and another substrate may be loaded into the reaction chamber for a pre-clean process on that other substrate.

It will be appreciated that maintaining a stationary substrate tray 206 and cooling body 208 may advantageously facilitate increased throughput, and/or reduced manufacturing costs. For example, performing a pre-clean process without having to move the substrate tray 206 and the cooling body 208 may facilitate shorter processing times (e.g., including for pre-clean processes comprising a plurality of cycles), simplified reaction chamber hardware components, and/or reduced equipment maintenance costs.

In some embodiments, one or both of the substrate tray 206 and the cooling body 208 can be moved relative to one another. In some embodiments, the substrate tray 206 remains stationary while the cooling body 208 is moved relative to the substrate tray 206. For example, the cooling body 208 may be moved away from the substrate tray 206 for sublimation of the pre-clean material and may be subsequently brought into contact with the substrate tray 206 to cool the substrate after desired sublimation is achieved. Distancing the cooling body 208 from the substrate tray 206 while heating the substrate tray 206 may facilitate rapid heating of the substrate tray 206 (e.g., due to using heat generated by heating elements of the substrate tray 206 to heat the substrate tray 206 and not the cooling body 208), while the cooling body 208 can be maintained at a significantly cooler temperature. Subsequent contact between the substrate tray 206 and the significantly cooler cooling body 208 may facilitate rapid cooling of the substrate tray 206 by transferring heat from the substrate tray 206 to the cooling body 208.

In some embodiments, the cooling body 208 can have a mass significantly higher than that of the substrate tray 206. Without being limited by any particular theory or mode of operation, such a cooling body 208 can facilitate rapid heating and cooling of the substrate tray 206. For example, a cooling body 208 having a sufficiently large mass may facilitate maintaining a temperature of the cooling body 208 at a sufficiently cool temperature during heating of the substrate tray 206, including if the cooling body 208 is in contact with the heated substrate tray 206. Direct contact of a heated substrate tray 206 with a cooling body 208 maintained at a desirably low temperature may facilitate subsequent cooling of the substrate tray 206 at desired rates, for example after the one or more heating elements 230 of the substrate tray 206 is turned off.

In some embodiments, the mass of the cooling body 208 is sufficiently large relative to the mass of the substrate tray 206 to facilitate maintaining a temperature of the cooling body 208 at a temperature for depositing a pre-clean material. Preferably, the temperature of the cooling body 208 does not exhibit a significant change during heating of the substrate tray 206, including if the cooling body is in contact with the heated substrate tray 206. For example, a bulk temperature of the cooling body 208 in direct contact with the substrate tray 206 can remain unchanged or substantially unchanged during heating of the substrate tray 206 and/or after heating of the substrate tray 206 is stopped. In some embodiments, the cooling body 208 can be maintained at a temperature of about 10° C. to about 50° C., including about 15° C. to about 30° C., about 25° C. to about 30° C. For example, the cooling body 208 can be maintained at a temperature of about 10° C. to about 15° C., while the substrate tray 206 is heated.

In some embodiments, a ratio of the mass of the cooling body 208 to the mass of the substrate tray 206 can be between about 10:1 to about 60:1 including about 10:1 to about 40:1, about 15:1 to about 30:1, or about 15:1 to about 25:1. For example, the ratio of the mass of the substrate tray 206 to the cooling body 208 can be about 1:20.

FIGS. 3A to 3C show an example of the movement of a cooling body 208 relative to a substrate tray 206. FIG. 3A shows configuration 350 comprising a substrate 302 over a substrate tray 206 and the substrate tray 206 over a cooling body 208. As shown in FIG. 3A, the substrate 302 can be on and in direct contact with the substrate tray 206, and the substrate tray 206 can be on and in direct contact with the cooling body 208. According to FIG. 3A, the substrate tray 206 can include a recess 310 on an upper surface configured to receive the substrate 302. The substrate 302 can be in direct contact with the substrate tray 206 along a portion of the upper surface of the substrate tray 206 within the recess 310. As described herein, in some embodiments, the substrate tray 206 may not have a recess on an upper surface to receive a substrate. For example, the substrate tray 206 may comprise have a flat upper surface on which the substrate 302 can be placed. In some embodiments, direct contact between the substrate 302 and the substrate tray 206 may facilitate heat transfer therebetween, and thereby facilitating desired temperature control of the substrate 302.

As shown in FIG. 3A, the cooling body 208 can have a recess 214 on an upper surface to receive the substrate tray 206. The recess 214 can be shaped and/or dimensioned such that the substrate tray 206 is in direct contact with a portion of the upper surface of the cooling body 208 within the recess 214. Direct contact between the substrate tray 206 and the cooling body 208 may facilitate heat transfer therebetween, thereby facilitating desired temperature control of the substrate tray 206.

Referring to FIG. 3A, a plurality of support elements 308 may be used to support the substrate tray 206. The support elements 308 may be disposed along (e.g., coupled to) a lower surface of the substrate tray 206 at positions across the lower surface to facilitate maintaining the substrate tray 206 at a desired position. For example, the support elements 308 may maintain the substrate tray 206 in a desired position while the cooling body 208 is moved relative to the substrate tray 206. In some embodiments, the substrate tray 206 can be coupled to fewer or more support elements 308 than that illustrated (e.g., three or four support elements 308). In some embodiments, connections to one or more substrate tray heating elements 230 can extend through the one or more support elements 308.

FIG. 3B shows a configuration 360 comprising the cooling body 208 at a distance from the substrate tray 206 such that the substrate tray 206 and the cooling body 208 are not in direct contact with one another. For example, the cooling body 208 can be lowered relative to the substrate tray 206 to separate the cooling body 208 and the substrate tray 206. In some embodiments, one or more positioning elements (not shown) can be coupled to the cooling body 208 and/or the substrate tray 206 and configured to move the cooling body 208 and/or the substrate tray 206. For example, the one or more positioning elements can be coupled to the cooling body 208 and can be configured to lower the cooling body 208 in response to receiving one or more control signals from the control unit 108 (FIG. 1). In some embodiments, separating the cooling body 208 from the substrate tray 206 can facilitate desired heating of the substrate tray 206.

In some embodiments, a cooling body 208 can be moved away from a substrate tray 206 prior to (e.g., immediately prior to), while, and/or after (e.g., immediately after) activating one or more heating elements 230 of the substrate tray 206, thereby allowing the substrate tray 206 to be relatively quickly heated to a higher temperature. In some embodiments, the cooling body 208 can be in direct contact with the substrate tray 206 during deposition of a pre-clean material onto a substrate surface, and the cooling body 208 can be subsequently lowered and separated from the substrate tray 206 after deposition of the pre-clean material is complete. For example, the cooling body 208 can be lowered immediately prior to (e.g., immediately prior to), during, and/or after (e.g., immediately after) initiating a process for sublimating the pre-clean material from the substrate surface. In some embodiments, the cooling body 208 can be at a distance from and not in direct contact with the substrate tray 206 during the entire or substantially entire process for sublimating the pre-clean material. In some embodiments, the cooling body heating elements 210 are not turned on during sublimation of the pre-clean material. For example, a temperature of the substrate tray 206 may be controlled independently from a temperature of the cooling body 208.

Referring to FIG. 3C, configuration 370 shows the cooling body 208 in contact with the substrate tray 206. The cooling body 208 at a distance below the substrate tray 206 can be raised to bring the cooling body 208 in contact with the substrate tray 206, thereby cooling the substrate tray. For example, subsequent to being lowered, the cooling body 208 can be raised such that the cooling body 208 is again in direct contact with the substrate tray 206. In some embodiments, one or more positioning elements coupled to the cooling body 208 can be configured to raise the cooling body 208 in response to receiving one or more control signals from a control unit.

As described herein, a cooling body 208 can be positioned at a distance away from a substrate tray 206 during sublimation of a pre-clean material. In some embodiments, the cooling body 208 can be subsequently raised after desired sublimation is achieved. For example, the one or more substrate tray heating elements 230 may be turned off after desired sublimation is complete, and the cooling body 208 may be raised to be in contact with the substrate tray 206 prior to (e.g., immediately prior to), during, or after (e.g., immediately after) turning off the one or more substrate tray heating elements 230. In some embodiments, the cooling body 208 is maintained at a temperature lower than a temperature of the substrate tray 206. In some embodiments, during the sublimation process, the cooling body 208 can be maintained at a temperature significantly lower than that of the substrate tray 206. For example, the cooling body 208 may be maintained at a temperature of about 20° C. to about 30° C. during the sublimation process, including about 20° C. to about 25° C. In some embodiments, during the sublimation process, the substrate tray 206 can be heated to a temperature of about 100° C. to about 150° C., or about 350° C. to about 400° C. Bringing the relatively cooler cooling body 208 in contact with the substrate tray 206 may facilitate heat transfer between the substrate tray 206 and the cooling body 208, facilitating desired cooling of the substrate tray 206.

In some embodiments, movement and/or timing of the movement of a substrate tray 206 and/or a cooling body 208 can be controlled by a control unit (e.g., the control unit 108 as described with reference to FIG. 1). For example, the control unit can be in communication with the reaction chamber (e.g., one or more positioning elements coupled to the cooling body within the reaction chamber, such as the reaction chamber 102 described with reference to FIG. 1) and may be configured (e.g., programmed) to initiate one or more control signals communicated to the reaction chamber for controlling when and how (e.g., raise or lower) the cooling body 208 is moved. In some embodiments, the control unit can initiate one or more control signals communicated to the reaction chamber for controlling one or more of the temperature control elements of the substrate tray 206 and/or one or more of the temperature control elements of the cooling body 208.

In some embodiments, the apparatuses of FIGS. 2 and 3 may be applied to carry out a pre-clean process that includes a plurality of cycles, each cycle of the pre-clean process including deposition of a pre-clean material on a substrate surface and sublimation of the deposited pre-clean material. For example, a pre-clean process comprising a plurality of cycles can be used to achieve the desired oxide material remove, rather than a pre-clean process comprising a single cycle to achieve the desired oxide material removal. For example, each cycle of the plurality of cycles may be configured to remove only a desired portion of the surface oxide material. In some embodiments, the plurality of cycles can be performed in the same reaction chamber (e.g., the reaction chamber 201 of FIG. 2A). In some embodiments, one or more parameters of a cycle of a pre-clean process may be different from that of another cycle of the pre-clean process. In some embodiments, a pre-clean process can include a plurality of cycles, where each of the plurality of cycles comprises similar or the same parameters. In some embodiments, the pre-clean process can include about 2 to about 20 cycles, including about 2 to about 5 cycles. In some other embodiments, the pre-clean process includes a single cycle.

In some embodiments, at least one cycle of the plurality of cycles can include movement of the cooling body 208. For example, the cooling body 208 can be brought into contact with the substrate tray 206. In some embodiments, the cooling body 208 is lowered and raised during each cycle of the plurality of cycles. In some embodiments, the cooling body 208 is stationary throughout the pre-clean process. For example, the cooling body 208 is stationary and remains in direct contact with the substrate tray 206 throughout each of the plurality of cycles. In some embodiments, neither the substrate tray 206 nor the cooling body 208 is moved during the pre-clean process.

In some embodiments, a substrate surface may comprise a silicon nitride material (e.g., a silicon nitride material used in formation of various electronic devices on the substrate surface, including spacer features for the electronic devices) and an oxide material (e.g., silicon oxide, germanium oxide, silicon germanium oxide) which is to be removed by the pre-clean process. In some embodiments, the oxide material can be selectively removed relative to the silicon nitride material on the substrate surface at a selectivity of greater than about 7:1. In some embodiments, the selectivity of a pre-clean process for removing the oxide relative to silicon nitride can be about 6:1 to about 150:1. For example, the selectivity can be about 6:1 to about 60:1, or about 7:1 to about 15:1, including about 8:1 to about 15:1 or about 8:1 to about 12:1.

It has been found that the selectivity of a first cycle of a pre-clean process can be significantly different from the selectivity of a subsequent cycle of the pre-clean process (e.g., the selectivity of removal of substrate surface oxide, such as a surface oxide comprising silicon and/or germanium, relative to another material on the substrate surface, such as silicon nitride material). In some embodiments, the subsequent cycle of the pre-clean process can advantageously demonstrate significantly higher selectivity compared to the first cycle of the pre-clean process. In some embodiments, a second cycle of a pre-clean process can demonstrate selective removal of the substrate surface oxide material relative to a silicon nitride on the substrate surface at a selectivity of about 30:1 to about 150:1, about 60:1 to about 150:1, or about 60:1 to about 100:1. A pre-clean process including a larger number of cycles may facilitate even higher selectivity performance.

In some embodiments, a pre-clean process comprising a plurality of cycles can facilitate desired removal of a surface oxide material while maintaining a desirably low number of defects. Without being limited by any particular theory of mode of operation, as feature sizes continue to shrink, formation of the pre-clean material on the surface of the substrate may contribute to clogging of the features (e.g., clogging of trench features), thereby hindering subsequent sublimation of the pre-clean material and/or removal of the oxide material from within the clogged features. Further without being limited by any particular theory or mode of operation, as feature sizes continue to shrink and aspect ratios increase, feature upper surfaces may experience over exposure to the pre-clean chemistry during pre-clean processes to achieve desired oxide removal within the features (e.g., at trench bottom portions). Removing the oxide material by performing a pre-clean process comprising a plurality of cycles of depositing and sublimating pre-clean material (e.g., each cycle having a shorter duration) may facilitate desired removal of the oxide material while reducing clogging of substrate surface features and/or reduce over exposure of feature upper surfaces to the pre-clean chemistry (e.g., as compared to a pre-clean process comprising the single longer cycle).

Figure 4:
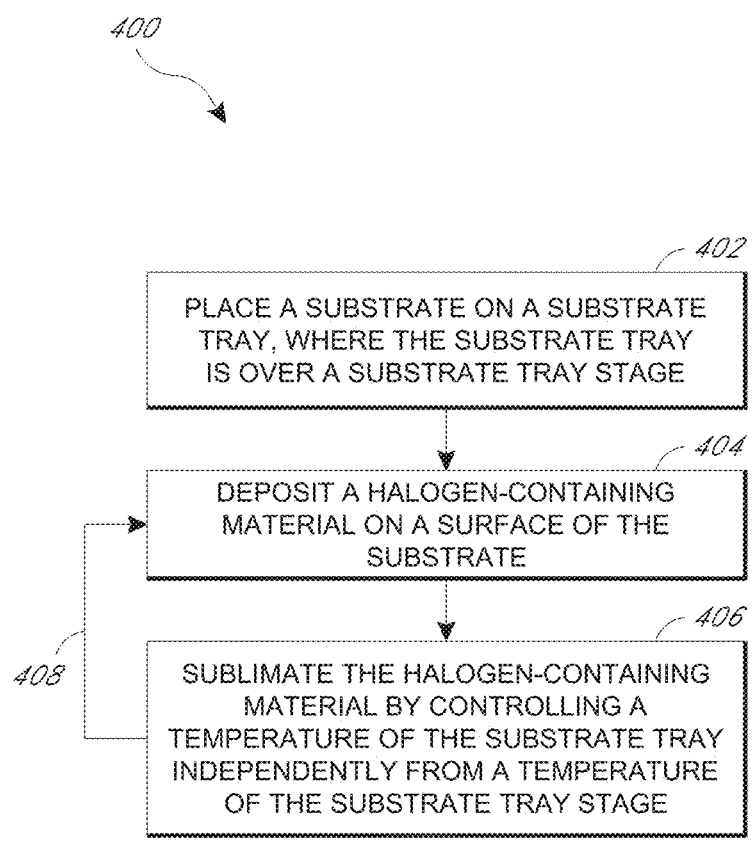
FIG. 4 shows an example of a process for pre-cleaning a substrate surface, according to some embodiments.

FIG. 4 shows an example of process 400 for pre-cleaning a surface of a substrate. In some embodiments, process 400 can be performed in a single reaction chamber (e.g., the reactor 200 as described with reference to FIG. 2A). In block 402, a substrate is placed on a substrate tray positioned over a cooling body. For example, the substrate may be placed in direct contact with a substrate tray. In block 404, a pre-clean material, such as a halogen-containing material, can be deposited onto a surface of the substrate. In some embodiments, the halogen-containing material can be formed by exposing an oxide on the substrate surface to a reactant gas of the pre-clean process. For example, the halogen-containing material may comprise one or more products resulting from the interaction between the reactant gas and the oxide material, including an oxide material comprising silicon and/or germanium. It will be appreciated that, at block 404, the temperature of the substrate is maintained in a relatively low level. For example, the substrate tray on which the substrate sits may be in direct contact with the cooling body and the heating elements of the substrate tray may be off or only providing heat at a low level, as discussed herein.

In block 406, the pre-clean material can be sublimated by controlling a temperature of the substrate tray independently from a temperature of the cooling body. The substrate tray may be heated to facilitate heating of the substrate while maintaining a temperature of the cooling body that a lower level. For example, one or more heating elements coupled to the substrate tray may be turned on without similarly increasing power to heating elements of the cooling body. In some embodiments, as discussed herein, the substrate tray may be separated from the cooling body to further facilitate heating of that tray.

With continued reference to FIG. 4, sublimation of the pre-clean material may facilitate removal of oxide material on the substrate surface. A target material can be subsequently formed on the pre-cleaned substrate surface. In some embodiments, the target material is formed on the pre-cleaned surface in a second reaction chamber. In some embodiments, the target material can be an epitaxial layer, such as an epitaxial silicon layer. In some embodiments, the target material is deposited in a different reaction chamber than the reaction chamber used for the pre-clean.

As shown in FIG. 4, in some embodiments, the pre-clean process 400 can include a plurality of cycles 408, where each cycle 408 includes blocks 404 and 406. For example, the pre-clean process 400 may include a repetition of blocks 404 and 406 for a desired number of times to achieve desired oxide removal from the substrate surface. In some embodiments, each cycle 408 comprising block 404 followed by block 406 removes only a portion of the oxide material, the plurality of cycles configured to remove or substantially remove the oxide material.

One or more of the plurality of cycles 408 of the pre-clean process 400 can be performed as described herein. For example, a reactant gas (e.g., concentration of various constituents of the reactant gas, activation and/or pre-heating of one or more constituents of the reactant gas), and/or one or more process parameters (e.g., a substrate temperature during formation and/or sublimation of a pre-clean material) of a cycle can be selected as described herein. In some embodiments, a reactant gas and/or one or more process parameters of a cycle can be the same as or different from that of another cycle in the pre-clean process.

The composition of the reactant gas for forming the halogen-containing material of the pre-clean process can include one or more carrier gases. A suitable carrier gas can include any number of inert gases. In some embodiments, the carrier gas can comprise argon (Ar). In some embodiments, the reactant gas can also include a halogen-containing gas. For example, the halogen-containing gas can be a fluorine-containing gas. Suitable fluorine-containing gases can include without limitation, nitrogen trifluoride ($NF_3$), hydrogen fluoride (HF), and/or diatomic fluorine ($F_2$). In some embodiments, the reactant gas can also include a hydrogen-containing gas. A suitable hydrogen-containing gas can include, for example, ammonia ($NH_3$).

As described herein, the pre-clean material can comprise one or more components formed by reaction of the reactant gas and a substrate surface oxide, including silicon oxide and germanium oxide. For example, a reactant gas comprising ammonia, and one or more fluorine-containing compounds can chemically react with the silicon oxide to generate water vapor, and a pre-clean material comprising nitrogen, hydrogen, and silicon. In some embodiments, ammonia and nitrogen trifluoride, hydrogen fluoride, and/or fluorine can react with silicon oxide to provide a pre-clean material comprising ammonium hexafluorosilicate (($NH_4$)$_2SiF_6$). In some embodiments, the pre-clean material can comprise for example ammonium fluoride ($NH_4F$) and/or ammonium hydrogen fluoride ($NH_4HF_2$).

Without being limited by any particular theory or mode of operation, it is believed that ammonium fluoride ($NH_4F$) may be formed when a fluorine (F) atom from a halogen-containing constituent of the reactant gas (e.g., $NF_3$, HF, and/or $F_2$) reacts with ammonia ($NH_3$) to form hydrogen fluoride (HF), which can combine with ammonia ($NH_3$) to form ammonium fluoride ($NH_4F$). In some embodiments, ammonium fluoride can remove silicon oxide by decomposing and reacting with silicon oxide to form silicon tetrafluoride ($SiF_4$) and water vapor ($H_2O$), and the tetrafluoride ($SiF_4$) can combine with $NH_4F$ to form ammonium hexafluorosilicate (($NH_4$)$_2SiF_6$), the ammonium hexafluorosilicate (($NH_4$)$_2SiF_6$) forming a film layer on the substrate surface. For example, the electronegative fluorine (F) of ammonium fluoride can be attracted to the relatively more electropositive silicon (Si) of the silicon oxide, while ammonium ($NH_4^+$) can be attracted to oxygen (O) of the silicon oxide. In some embodiments, a pre-clean material comprising ammonium hexafluorosilicate (($NH_4$)$_2SiF_6$) can be decomposed and/or volatilized by heating the substrate, for example decomposing to form tetrafluoride ($SiF_4$), ammonia ($NH_3$) and/or hydrogen fluoride (HF). In some embodiments, the surface oxide comprises germanium oxide and the pre-clean material comprises ammonium hexafluorogermanate (($NH_4$)$_2GeF_6$), such that ammonium hexafluorogermanate is volatized and/or decomposed by heating the substrate.

In some embodiments, the substrate can be maintained at a desired temperature during formation of the pre-clean material, including for example while the substrate surface is exposed to a reactant gas of the pre-clean process. In some embodiments, the substrate may be maintained at a temperature above a condensation temperature of the reactant gas during formation of the pre-clean material. For example, the substrate can be maintained at a temperature of greater than about 15° C., or greater than about 20° C. in some embodiments. In some embodiments, the substrate can be maintained at a temperature of about 15° C. to about 50° C., including about 15° C. to about 30° C., about 25° C. to about 30° C. For example, the substrate can be maintained at a temperature of about 22° C. to about 28° C., which can facilitate a high selectivity for the removal of silicon oxide and/or germanium oxide relative to silicon nitride material on substrate surface.

The pre-clean material may be removed (e.g., decomposed and/or volatilized) using various techniques. In some embodiments, the pre-clean material can be removed through heating of the substrate to a temperature near, at, or above a sublimation temperature of components of the pre-clean material. For example, the substrate can be heated to a temperature of about 80° C. to about 500° C., including about 80° C. to about 150° C., about 300° C. to about 500° C., and about 300° C. to about 400° C., under conditions that facilitate sublimation of the pre-clean material. For example, the substrate can be heated to a temperature of about 120° C. or about 380° C. to cause sublimation of the ammonium hexafluorosilicate ($(NH_4)_2SiF_6$)), and/or ammonium hexafluorogermanate ($(NH_4)_2GeF_6$).

It will be appreciated that the temperature of the substrate may be regulated by heating of the substrate tray on which the substrate sits, and the cooling or transfer heat from that substrate tray. It will also be appreciated that heating the substrate may be augmented by other approaches for providing energy to the substrate. For example, the pre-clean material can be exposed to gas species activated by a remote plasma source. In some embodiments, the species activated by the remote plasma source can interact with one or more components of the pre-clean material to form volatile species which can, for example, be removed from the substrate surface. In some embodiments, the gas species can be an inert gas species (e.g., Ar, $N_2$, He, etc.).

In some embodiments, the halogen-containing pre-clean material can be exposed to heated gas (e.g., heated inert gas) to facilitate removal of the pre-clean material. The gas can be heated to a temperature sufficient to heat the pre-clean material to a temperature that causes at least part of the pre-clean material to enter the vapor phase. For example, the temperature may be greater than about 80° C., about 100° C., about 120° C., or about 150° C. In some embodiments, the temperature may be greater than about 300° C., about 350° C., about 400° C. and about 450° C.

In some embodiments, a pre-clean material can be exposed to ultra-violet (UV) and/or infrared (IR) radiation to facilitate removal of the pre-clean material. For example, the UV and/or IR radiation can provide energy that causes at least part of the pre-clean material to enter the vapor phase.

In some embodiments, exposing the pre-clean material to gas species activated by a remote plasma source, heated reactant gas, and/or ultra-violet radiation, can reduce the moisture content of the reaction chamber. Advantageously, the reduced moisture content can promote the sublimation of pre-clean material, since the sublimation can generate $H_2O$.

In some embodiments, removal of the pre-clean material can be performed during transfer of the substrate from a first reaction chamber (e.g., a reaction chamber in which the pre-clean material is formed) to a second different reaction chamber (e.g., a reaction chamber in which subsequent processing is performed, such as formation of a target material on the substrate). For example, a pre-clean material may be exposed to ultra-violet radiation and/or infrared radiation while being transferred from the first reaction chamber to the second reaction chamber.

One or more constituents of the pre-clean process reactant gas may be activated by a plasma source. For example, one or more constituents of the reactant gas may be activated by a remote plasma source (e.g., a remote plasma unit, or RPU), such as by flowing the one or more constituents through the remote plasma source to generate one or more activated reactant species (e.g., generate charged ions, and/or neutral atoms and/or radicals). In some embodiments, at least one of the constituents of the reactant gas is not activated by a plasma source.

In some embodiments, a substrate surface pre-clean process can include a carrier gas (e.g., argon), halogen-containing gas, and/or hydrogen-containing gas (e.g., to provide reactant species comprising argon-containing, halogen-containing, and/or hydrogen-containing charged ions, atoms, and/or radicals), at least one of which is plasma-activated.

For example, a reactant gas comprising argon (Ar) may be activated by a remote plasma source, such as by flowing the argon gas through a remote plasma unit. In some embodiments, a fluorine-containing gas can be activated by being flowed through the remote plasma unit prior to being introduced into a reaction chamber. In some embodiments, the hydrogen-containing gas (e.g., ammonia) can be activated by flowing the hydrogen-containing gas through a remote plasma unit.

In some embodiments, one or more of the carrier gas, halogen-containing gas, and hydrogen-containing gas may not be plasma-activated. For example, unactivated reactant gas may not flow through a remote plasma source before the substrate surface is exposed to it in the reaction chamber. In some embodiments, the carrier gas can be activated by a remote plasma source while the halogen-containing gas and the hydrogen-containing gas may not be activated by a remote plasma source. For example, a fluorine containing gas and a hydrogen containing gas can be introduced into the reaction chamber without flowing the gases through a plasma source. In some embodiments, all constituents of the reactant gases are activated by a remote plasma source, including for example the carrier gas, the halogen-containing gas, and the hydrogen-containing gas.

In some embodiments, the substrate surface can be exposed to the activated reactant species and the unactivated reactant species simultaneously or substantially simultaneously, for example combining the activated reactant species and the unactivated reactant species prior to delivery into the reaction chamber. In some embodiments, the substrate surface can be sequentially exposed to the activated reactant species and/or the unactivated reactant species. For example, the substrate surface may be first exposed to activated reactant species (e.g., activated by a remote plasma unit) of one or more constituents of the reactant gas, followed by exposure to a second activated or unactivated reactant species (e.g., unactivated by a remote plasma unit) of another of the one or more constituents of the reactant gas. In some embodiments, the substrate surface can be first exposed to unactivated reactant species followed by exposure to activated reactant species. The sequence of exposure can be selected to provide desired pre-clean process performance. For example, a substrate surface can be first exposed to carrier gas and fluorine-containing gas activated by a remote plasma unit, followed by exposure to a combination of unactivated hydrogen-containing gas (e.g., ammonia) and fluorine-containing gas, or by exposure first to unactivated hydrogen-containing gas and then to unactivated fluorine-containing gas.

In some embodiments, unactivated reactant gas can be combined with one or more reactant gases activated by a plasma source before being introduced into the reaction chamber. For example, unactivated reactant gas can be combined with reactant gas activated by a remote plasma source downstream of the remote plasma source prior to being introduced into the reaction chamber. In some embodiments, constituents of a reactant gas can be sequentially introduced into the reaction chamber. For example, the substrate may be first exposed to one or more activated constituents of the reactant gas, followed by one or more unactivated components of the reactant gas, or vice versa. In some embodiments, activated constituents and/or unactivated constituents of the reactant gas may themselves be sequentially introduced into the reaction chamber (e.g., a first activated constituent of the reactant gas, followed by a second activated constituent of the reactant gas).

In some embodiments, a carrier gas (e.g., argon) activated by a remote plasma source can be combined with an unactivated halogen-containing gas (e.g., hydrogen fluoride, diatomic fluorine, and/or nitrogen trifluoride) and unactivated hydrogen-containing gas (e.g., ammonia) at a location downstream of the remote plasma source, before the activated carrier gas and unactivated halogen-containing gas and unactivated hydrogen-containing gas are introduced into a reaction chamber. In some embodiments, a carrier gas (e.g., argon) and a halogen-containing gas (e.g., hydrogen fluoride, diatomic fluorine, and/or nitrogen trifluoride) are combined and activated by a remote plasma source, then combined with an unactivated hydrogen-containing gas (e.g., ammonia) at a location downstream of the remote plasma source before the activated carrier gas, the activated halogen-containing gas and the unactivated hydrogen-containing gas are introduced into a reaction chamber. In some embodiments, a carrier gas (e.g., argon), a halogen-containing gas (e.g., hydrogen fluoride, diatomic fluoride, and/or nitrogen trifluoride) and a hydrogen-containing gas (e.g., ammonia), are all activated by a remote plasma source. For example, the carrier gas, the halogen-containing gas and the hydrogen-containing gas may be combined prior to flowing the gases through the remote plasma source.

In some embodiments, formation of a pre-clean material can include first introducing into a reaction chamber a combination of a carrier gas (e.g., argon) and a halogen-containing gas (e.g., hydrogen fluoride, diatomic fluorine, and/or nitrogen trifluoride) activated by a remote plasma source, followed by a combination of unactivated halogen-containing gas (e.g., hydrogen fluoride) and hydrogen-containing gas (e.g., ammonia). In some embodiments, formation of a pre-clean material can include first introducing into a reaction chamber a combination of a carrier gas and a halogen-containing gas activated by a remote plasma source, then sequential flow of unactivated halogen-containing gas followed by unactivated hydrogen-containing gas.

In some embodiments, one or more processes can be used for gas removal from the reaction chamber (e.g., removal of an existing reaction chamber atmosphere, which may include excess reactant gas and/or gaseous reaction byproducts). In some embodiments, one or more gas removal processes can be used between flows of constituents of the reactant gas into the reaction chamber. For example, the reaction chamber may be evacuated and/or purged. Various inert gases may be used in the purge process, including for example nitrogen ($N_2$), helium (He), and/or argon (Ar). In some embodiments, unactivated inert gas can be used in the purge process (e.g., unactivated $N_2$, He, and/or Ar).

A sequence of gas flow in a pre-clean process can include, for example, first introducing into the reaction chamber a combination of a carrier gas (e.g., argon) and a halogen-containing gas (e.g., hydrogen fluoride, diatomic fluorine, and/or nitrogen trifluoride) activated by a remote plasma source, followed by a gas removal process, and then followed by flow into the reaction chamber of a combination of unactivated halogen-containing gas (e.g., hydrogen fluoride) and hydrogen-containing gas (e.g., ammonia).

In some embodiments, a gas removal process can be used prior to starting the flow of reactant gas and/or subsequent to stop of flow of reactant gas into the reaction chamber. In some embodiments, one or more purge processes can be performed prior to starting flow of reactant gas into the reaction chamber and/or subsequent to stopping flow of reactant gas into the reaction chamber. For example, one or more inert gases (e.g., argon, including unactivated argon) can be flowed into the reaction chamber prior to starting flow of reactant gas and, in some embodiments, subsequent to stopping the flow of the reactant gas into the reaction chamber. An example of a sequence of gas flow can include, for example, performing a first reaction chamber purge process including flowing into the reaction chamber one or more inert gases, then introducing constituents of the reactant gas into the reaction chamber. After stopping the flow of constituents of the reactant gas, a second purge process can be performed, where the second purge process includes flowing into the reaction chamber one or more inert gases for purging the reaction chamber of excess constituents of the reactant gas and/or gaseous reaction byproducts.

In some embodiments, one or more inert gases of a purge process can be flowed through the remote plasma unit prior to being introduced into the reaction chamber. The one or more inert gases of the purge process may not be plasma activated within the remote plasma unit (e.g., flow of the one or more inert gases through the remote plasma unit may occur while the plasma is not ignited within the remote plasma unit). For example, the one or more inert gases may be used to purge the remote plasma unit and/or for subsequently igniting the plasma in the remote plasma unit. For example, after flowing an inert gas through the remote plasma unit for a desired duration of time while the plasma is not ignited, flow of the inert gas through the remote plasma unit may be continued such that plasma within the remote plasma unit can be ignited with that inert gas flowing through the remote plasma unit.

In some embodiments, one or more constituents of the reactant gas can be maintained at a desired temperature when introduced into the reaction chamber. For example, one or more of the carrier gas, the halogen-containing gas, and the hydrogen-containing gas may be heated prior to being introduced into the reaction chamber for forming the pre-clean material. In some embodiments, the hydrogen-containing gas is heated. For example, the hydrogen-containing gas may be heated to a temperature of about 30° C. to about 120° C., including about 80° C. to about 115° C., about 70° C. to about 110° C., about 70° C. to about 105° C., and about 70° C. to about 100° C. Pre-heating may advantageously facilitate improved pre-clean process performance, for example facilitating formation of the pre-clean material. In some embodiments, a substrate surface pre-clean process can include a pre-heated ammonia gas, the ammonia gas being heated to a temperature of about 80° C. to about 115° C. One or more other constituents of the reactant gas may also be pre-heated.

It has been found that the ratio of the various reactant gases in the pre-clean process can impact selectivity in the removal of the silicon oxide material with respect to silicon nitride. In some embodiments, a reactant gas for a pre-clean process can have a molar ratio of a halogen-containing gas to a hydrogen-containing gas of about 3:1 to about 10:1. In some embodiments, the molar ratio can be about 4:1 to about 10:1, including about 5:1 to about 10:1. For example, the reactant gas for the pre-clean process can have a molar ratio of ammonia to nitrogen trifluoride, hydrogen fluoride and/or fluorine gas of about 4.5:1. In some embodiments, a molar ratio of ammonia activated by a remote plasma source to unactivated nitrogen trifluoride pre-heated in its transfer tube can be about 3:1. Advantageously, such ratios can provide high levels of selectivity for removing a surface oxide relative to silicon nitride.

An example sequence of a pre-clean process can include providing into a first reaction chamber (e.g., the reaction chamber 201) a substrate having a surface to be cleaned. The substrate can be maintained at a temperature of about 15° C.

to about 30° C. within the first reaction chamber. For example, the substrate can be maintained at a temperature of about 17° C. to about 29° C. A first purge process can be performed prior to starting flow of reactant gas into the first reaction chamber. For example, unactivated argon gas can be flowed into the first reaction chamber, after the substrate is provided within the first reaction chamber, and prior to starting flow of reactant gas. The unactivated argon gas may be flowed through the remote plasma unit prior to introducing the unactivated argon gas into the first reaction chamber. For example, the unactivated argon gas may be flowed through the remote plasma unit while no plasma is ignited in the remote plasma unit. Once desired purging of the first reaction chamber is completed, an unactivated hydrogen-containing gas (e.g., unactivated ammonia ($NH_3$)) may be introduced into the first reaction chamber. The unactivated hydrogen-containing gas can be not pre-heated prior to being introduced into the first reaction chamber (e.g., unactivated $NH_3$ introduced into the first reaction chamber can be not pre-heated). Subsequently, plasma within the remote plasma unit can be ignited with the argon gas flowing through that unit and into the first reaction chamber. A halogen-containing gas, such as nitrogen trifluoride ($NF_3$), can subsequently be activated by the remote plasma unit by flowing the halogen-containing gas through the remote plasma unit and into the reaction chamber. After a desired formation of a substrate surface pre-clean material, the flow of reactant gas may be stopped and the plasma in the remote plasma unit may be turned off. A second purge process can be performed after stopping flow of the reactant gas. For example, unactivated argon gas can be flowed into the reaction chamber in the second purge process. The unactivated argon gas may be flowed through the remote plasma unit during the second purge process prior to being introduced into the first reaction chamber. The substrate surface pre-clean material may be subsequently removed in the first reaction chamber. As described herein removal of the substrate surface pre-clean material may include sublimation of the substrate surface pre-clean material by heating the substrate surface pre-clean material to a temperature of greater than about 80° C., including about 120° C. and about 380° C.

The substrate having the pre-cleaned surface may subsequently be removed from the first reaction chamber and transferred to a second, different chamber. In some embodiments, a target material can be formed on the pre-cleaned substrate surface in the second reaction chamber, including formation of an epitaxial material layer. In some embodiments, a pre-clean process having such a sequence can advantageously facilitate achieving high selectivity (e.g., the selectivity of removal of substrate surface silicon oxide relative to another material on the substrate surface, such as silicon nitride material), including a selectivity of about 14:1. In some embodiments, a pre-clean process having such a sequence can advantageously facilitate achieving improved selectivity as described herein.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

What is claimed is:

1. A system for integrated circuit fabrication, the system comprising:
   a reaction chamber for processing a substrate;
   a substrate tray to receive the substrate within the reaction chamber;
   a first heating element coupled to the substrate tray and configured to control the temperature of the substrate tray;
   a cooling body to receive the substrate tray;
   a second heating element embedded in the cooling body and configured to increase a temperature of the cooling body independently of the substrate tray and the first heating element;
   a cooling element coupled to the cooling body and configured to decrease the temperature of the cooling body, wherein the cooling element is capable of being activated concurrently with the second heating element;
   a precursor source in fluid communication with the reaction chamber;
   a control unit in communication with the reaction chamber and programmed to provide one or more control signals to:
   remove an oxide material from a surface of the substrate by initiating a plurality of sequential thermal cycles in the reaction chamber without transferring the substrate to a different reaction chamber, each thermal cycle comprising:
   cooling the substrate to a deposition temperature by transferring heat from the substrate tray to the cooling body, wherein cooling the substrate to the deposition temperature comprises reducing a distance between the cooling body and the substrate tray;
   flowing precursor from the precursor source into the reaction chamber to deposit a material on the cooled substrate at the deposition temperature;
   heating the cooled substrate to a temperature sufficient to sublimate the material, wherein heating the cooled substrate comprises increasing a distance between the cooling body and the substrate tray, wherein a ratio of a mass of the cooling body to a mass of the substrate tray is in a range of 10:1 to 60:1; and
   a positioning element configured to move one or both of the cooling body and the substrate tray relative to one another wherein the control unit is further programmed to:
   provide control signals to move one or both of the substrate tray and the cooling body relative to one another such that the substrate tray is in direct contact with the cooling body; and
   provide control signals to move one or both of the substrate tray and the cooling body relative to one another such that the substrate tray is not in direct contact with the cooling body.

2. The system of claim 1, comprising a plurality of cooling elements coupled to the cooling body, wherein the plurality of cooling elements is distributed across a lateral dimension of the cooling body.

3. The system of claim 1, wherein the first heating element is coupled to an external surface of the substrate tray.

4. The system of claim 1, wherein the first heating element is embedded in the substrate tray.

5. The system of claim 1, wherein the substrate tray comprises at least one of silicon carbide and aluminum nitride.

6. The system of claim 1, wherein the substrate tray is affixed to the cooling body.

7. The system of claim 1, further comprising sources of a halogen-containing component and a hydrogen-containing component in gas communication with the reaction chamber.

8. The system of claim 7, further comprising a remote plasma generator for activating at least one of the halogen-containing component and the hydrogen-containing component.

9. The system of claim 1, wherein the cooling body is a susceptor.

10. The system of claim 1, wherein the second heating element and the cooling element are configured to actively maintain a temperature of the cooling body below a temperature of the substrate tray during a depositing of a halogen-containing material on the substrate and during a sublimating of the halogen-containing material.

11. The system of claim 10, wherein the substrate tray and the cooling body are configured to maintain direct contact during the depositing of the halogen-containing material.

12. The system of claim 1, wherein the substrate comprises a surface, wherein the surface comprises silicon.

13. The system of claim 12, wherein the surface further comprises germanium.

14. The system of claim 1, wherein the surface further comprises silicon nitride.

15. The system of claim 1, wherein the cooling body comprises a solid material.

16. The system of claim 1, wherein the substrate tray is disposed over the cooling body.

17. The system of claim 1, wherein the cooling body comprises an upper solid surface.

18. The system of claim 17, wherein the upper solid surface comprises one or more raised or recessed features.

19. The system of claim 1, wherein the material comprises hexafluoro silicate (($NH_4)_2SiF_6$).

20. The system of claim 18, wherein the one or more raised or recessed features comprise a recess shaped and dimensioned such that the substrate tray sits within the recess when the substrate tray is received by the cooling body.

* * * * *

UNITED STATES PATENT AND TRADEMARK OFFICE
CERTIFICATE OF CORRECTION

| | | |
|---|---|---|
| PATENT NO. | : 11,264,255 B2 | Page 1 of 1 |
| APPLICATION NO. | : 16/447297 | |
| DATED | : March 1, 2022 | |
| INVENTOR(S) | : John Tolle | |

It is certified that error appears in the above-identified patent and that said Letters Patent is hereby corrected as shown below:

In the Specification

In Column 19, Line 6, delete "($(NH_4)_2SiF_6$))," and insert --($(NH_4)_2SiF_6$),--.

In the Claims

In Column 26, Claim 19, Line 19, delete "hexafluoro silicate" and insert --ammonium hexafluorosilicate--.

Signed and Sealed this
Fourteenth Day of June, 2022

*Katherine Kelly Vidal*

Katherine Kelly Vidal
*Director of the United States Patent and Trademark Office*